(12) United States Patent
Lee et al.

(10) Patent No.: US 11,299,793 B2
(45) Date of Patent: Apr. 12, 2022

(54) STEEL SHEET HAVING EXCELLENT RESISTANCE TO LIQUID METAL EMBRITTLEMENT CRACKS AND METHOD FOR MANUFACTURING THE SAME

(71) Applicant: POSCO, Pohang-si (KR)

(72) Inventors: Sea-Woong Lee, Gwangyang-si (KR); Kyoo-Young Lee, Gwangyang-si (KR); Joo-Hyun Ryu, Gwangyang-si (KR); Ki-Cheol Kang, Gwangyang-si (KR)

(73) Assignee: POSCO, Pohang-si (KR)

( * ) Notice: Subject to any disclaimer, the term of this patent is extended or adjusted under 35 U.S.C. 154(b) by 178 days.

(21) Appl. No.: 16/609,017

(22) PCT Filed: Jun. 22, 2018

(86) PCT No.: PCT/KR2018/007085
§ 371 (c)(1),
(2) Date: Oct. 28, 2019

(87) PCT Pub. No.: WO2019/004662
PCT Pub. Date: Jan. 3, 2019

(65) Prior Publication Data
US 2020/0140971 A1 May 7, 2020

(30) Foreign Application Priority Data
Jun. 30, 2017 (KR) .................. 10-2017-0083462

(51) Int. Cl.
*C21D 9/46* (2006.01)
*C22C 38/04* (2006.01)
(Continued)

(52) U.S. Cl.
CPC .............. *C21D 9/46* (2013.01); *C21D 1/26* (2013.01); *C21D 6/002* (2013.01); *C21D 6/005* (2013.01);
(Continued)

(58) Field of Classification Search
None
See application file for complete search history.

(56) References Cited

U.S. PATENT DOCUMENTS

2013/0087253 A1   4/2013   Matsuda et al.
2013/0295402 A1   11/2013  Oh et al.
(Continued)

FOREIGN PATENT DOCUMENTS

CN   101638749   1/2011
CN   103060678   4/2013
(Continued)

OTHER PUBLICATIONS

International Search Report—PCT/KR2018/007085 dated Oct. 10, 2018.
(Continued)

*Primary Examiner* — Scott R Kastler
(74) *Attorney, Agent, or Firm* — Cantor Colburn LLP

(57) ABSTRACT

Provided is a steel sheet having excellent resistance to liquid metal embrittlement cracks and a method for manufacturing the same. The steel sheet includes, by weight %, 0.04% to 0.35% of C, 0.99% or less of Al+Si, 3.5% to 10% of Mn, 0.05% or less of P (excluding 0%), 0.02% or less of S (excluding 0%), and 0.02% or less of N (excluding 0%) with a remainder of Fe and other inevitable impurities, wherein the steel sheet comprises a microstructure comprising at least 10% of residual austenite, at least 60% of annealed martensite and 20% or less of alpha martensite and epsilon martensite, by volume fraction, and an average thickness of a Mn-depleted layer is at least 0.5 μm from a product surface.

16 Claims, 3 Drawing Sheets

(51) Int. Cl.
    *C21D 1/26*     (2006.01)
    *C21D 6/00*     (2006.01)
    *C21D 8/02*     (2006.01)
    *C22C 38/00*    (2006.01)
    *C22C 38/02*    (2006.01)
    *C22C 38/06*    (2006.01)
    *C22C 38/12*    (2006.01)
    *C22C 38/14*    (2006.01)
    *C22C 38/38*    (2006.01)
    *C23C 2/02*     (2006.01)
    *C23C 2/06*     (2006.01)
    *C23C 2/12*     (2006.01)
    *C23C 2/40*     (2006.01)
    *C23C 14/16*    (2006.01)

(52) U.S. Cl.
    CPC ........... *C21D 6/008* (2013.01); *C21D 8/0205* (2013.01); *C21D 8/0226* (2013.01); *C21D 8/0236* (2013.01); *C21D 8/0263* (2013.01); *C22C 38/001* (2013.01); *C22C 38/002* (2013.01); *C22C 38/02* (2013.01); *C22C 38/04* (2013.01); *C22C 38/06* (2013.01); *C22C 38/12* (2013.01); *C22C 38/14* (2013.01); *C22C 38/38* (2013.01); *C23C 2/02* (2013.01); *C23C 2/06* (2013.01); *C23C 2/12* (2013.01); *C23C 2/40* (2013.01); *C23C 14/16* (2013.01); *C21D 2211/001* (2013.01); *C21D 2211/008* (2013.01)

(56) References Cited

U.S. PATENT DOCUMENTS

| | | | |
|---|---|---|---|
| 2014/0230971 | A1 | 8/2014 | Kawasaki et al. |
| 2014/0360632 | A1 | 12/2014 | Hasegawa et al. |
| 2017/0051378 | A1 | 2/2017 | Lee et al. |
| 2017/0088914 | A1 | 3/2017 | Ikeda et al. |
| 2017/0152580 | A1* | 6/2017 | Kimura ................. C21D 8/0226 |
| 2017/0211164 | A1 | 7/2017 | Kimura et al. |
| 2017/0306429 | A1* | 10/2017 | Kurnsteiner ............ C21D 1/26 |
| 2018/0230569 | A1* | 8/2018 | Kawamura ............ C21D 6/008 |

FOREIGN PATENT DOCUMENTS

| | | |
|---|---|---|
| CN | 103890202 | 6/2014 |
| EP | 3181715 | 6/2017 |
| EP | 3372703 | 9/2018 |
| JP | 2003138345 | 5/2003 |
| JP | 2011190506 | 9/2011 |
| KR | 20120073407 | 7/2012 |
| KR | 20120113806 | 10/2012 |
| KR | 20140060574 | 5/2014 |
| KR | 20140075789 | 6/2014 |
| KR | 20160078839 | 7/2016 |
| KR | 101677396 | 11/2016 |
| WO | 2015174605 | 11/2015 |
| WO | 2016013145 | 1/2016 |
| WO | 2016063467 | 4/2016 |

OTHER PUBLICATIONS

Baptiste, et al., Electromagnetic levitation: A new technology for high rate physical vapour deposition of coatings onto metallic strip, Surface & Coatings Technology, vol. 202, 2007, pp. 1189-1193.

European Search Report—European Application No. 18822677.3 dated Jun. 29, 2020, citing EP 3181715, US 2017/088914, WO 2016/013145, and Baptiste, et al.

Chinese Office Action—Chinese Application No. 201880034436.9 dated Jan. 28, 2021, citing WO 2016/063467, CN 103890202, WO 2015/174605, JP 2003-138345, and JP 2011-190506.

\* cited by examiner (a)

(b)

STEEL SHEET HAVING EXCELLENT RESISTANCE TO LIQUID METAL EMBRITTLEMENT CRACKS AND METHOD FOR MANUFACTURING THE SAME

CROSS-REFERENCE TO RELATED APPLICATIONS

This application is a national entry of PCT Application No. PCT/KR2018/007085 filed on Jun. 22, 2018, which claims priority to and the benefit of Korean Application No. 10-2017-0083462 filed on Jun. 30, 2017, in the Korean Patent Office, the entire contents of which are incorporated herein by reference.

TECHNICAL FIELD

The present invention relates to a steel sheet having excellent resistance to liquid metal embrittlement cracks and a method for manufacturing the same.

BACKGROUND ART

There are contradictory aspects, in that thicknesses of steel sheets need to be reduced to lighten automotive steel sheets, while thicknesses of such steel sheets need to be increased to secure collision safety. In order to resolve this contradiction, it is necessary to increase moldability of a material while increasing strength of the material, and this is known to be feasible through utilization of various types of steel in automotive steel sheets, such as dual phase steel (hereinafter, "DP steel"), known as advanced high strength steel (AHSS), transformation-induced plasticity steel (hereinafter, "TRIP steel") and complex phase steel (hereinafter, "CP steel").

Although the strength of steel can be increased by increasing a carbon content or an alloying content of an advanced high strength steel, tensile strength, which can be achieved in consideration of practical aspects such as spot weldability, and the like, is limited to about 1200 MPa. In addition, when the carbon content or an alloying content of an advanced high strength steel is increased to secure such strength, cracks may be generated due to liquid metal embrittlement of a spot-welded portion of a plating material, thereby making it difficult to expand applications of ultra-high strength steels.

FIG. 1 is a photographic image of a steel material having liquid metal embrittlement cracks generated after spot welding. As illustrated in FIG. 1, cracks occurring after the spot welding are classified as type A to C cracks, according to occurrence sites: type A is a type of crack occurring in a welding electrode-contacting portion and is known to have an insignificant effect on material performance, and types B and C cracks, occurring respectively in a weld shoulder and a base material, have significant effects on material performance and are thus managed under strict standards. Liquid metal embrittlement is known to be caused by the following three factors:

Material: alloying elements (silicon (Si), aluminum (Al), boron (B), vanadium (V), etc.), surface microstructure, grain size, base material strength Plating: plating amount, plating layer composition/melting point Welding: heat input, electrode gap, misalignment of welding electrode Existing techniques for accomplishing ultra-high strength steel have been variously developed. Patent Documents 1 and 2 describe a steel having remarkably excellent properties, that is, a product of tensile strength and ductility of at least 30,000 MPa %, using 3.5 wt % to 9 wt % of Mn and 2 wt % to 9 wt % of Mn, respectively, but are completely silent on cracks in a welded portion occurring in a plating material or any solution to such cracks.

Patent document 3 provides a method for manufacturing a high strength steel sheet of which tensile strength is at least 980 MPa and a product of tensile strength and ductility is 24,000 MPa using 3.5 wt % to 10 wt % of Mn.

Those patent documents fail to provide a solution for liquid metal embrittlement of a spot welded portion.

(Prior Art Document)
(Patent Document 1) Chinese Patent Publication No. 101638749B
(Patent Document 2) Chinese Patent Publication No. 103060678A
(Patent Document 1) Korean Patent Publication No. 2014-000574

DISCLOSURE

Technical Problem

An aspect of the present invention is to not only provide a product having a high product of tensile strength and ductility but also an ultra high-strength and high ductility steel sheet having excellent resistance to liquid metal embrittlement, and a manufacturing method therefor.

Technical Solution

An exemplary embodiment of the present disclosure provides a steel sheet including, by weight %, 0.04% to 0.35% of carbon (C), 0.99% or less of aluminum (Al)+silicon (Si), 3.5% to 10% of manganese (Mn), 0.05% or less of phosphorous (P) (excluding 0%), 0.02% or less of sulfur (S) (excluding 0%), and 0.02% or less of nitrogen (N) (excluding 0%) with a remainder of iron (Fe) and other inevitable impurities, wherein the steel sheet comprises a microstructure comprising at least 10% by volume fraction of residual austenite, at least 60% by volume fraction of annealed martensite and 20% or less by volume fraction of alpha martensite and epsilon martensite, and an average thickness of a Mn-depleted layer is at least 0.5 μm from a product surface.

Another exemplary embodiment provides a method of manufacturing a steel sheet having excellent resistance to liquid metal embrittlement cracks, including reheating a steel slab comprising: 0.04% to 0.35% of C, 0.99% or less of Al+Si, 3.5% to 10% of Mn, 0.05% or less of P (excluding 0%), 0.02% or less of S(excluding 0%), and 0.02% or less of N (excluding 0%) with a remainder of Fe and other inevitable impurities, by weights, at a temperature of 1100° C. to 1300° C., finish-hot-rolling the reheated steel slab at a temperature of Ar3 point to 1000° C. to obtain a hot-rolled steel sheet, coiling the hot-rolled steel sheet at a temperature of 720° C. or less, heat-treating the coiled hot-rolled steel sheet at a temperature in the range of Ac1 point to Ac1+(Ac3−Ac1)/2 for at least 30 minutes, pickling the heat-treated hot-rolled steel sheet for at least 3 seconds, cold-rolling the pickled hot-rolled steel sheet to obtain a cold-rolled steel sheet; and two-phase annealing the cooled cold-rolled steel sheet a temperature in the range of 580° C. to 900° C. for 10 seconds to 5 minutes.

Advantageous Effects

According to an aspect of the present disclosure, resistance to cracks occurring during spot welding can be increased, thereby enabling manufacturing of an ultra-high strength and high ductility steel sheet for cold press molding without a reduction in material performance even after welding.

BEST MODE

Figure 1:
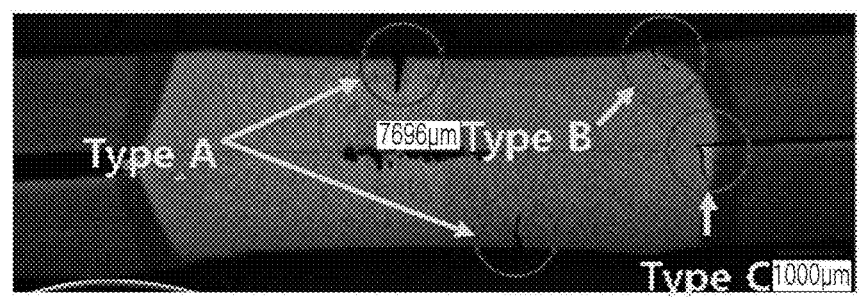
FIG. 1 is a photographic image of a steel material in which a liquid metal embrittlement cracking occurred after spot welding.

The present inventors have completed the present invention having knowledge that a steel sheet having excellent resistance to liquid metal embrittlement cracks can be provided by creating a certain level or more of Mn-depleted layers through properly controlling an alloy composition and microstructure as well as manufacturing conditions such as an Al+Si content and a pickling time.

Hereinafter, preferred embodiments of the present invention will be described. Alloying components and a composition range will be described. Hereinafter, a unit of amounts of each element refers to weight %, unless otherwise indicated.

C: 0.04% to 0.35%

Carbon (C) is an important element, which is added to steel for stabilization of remaining austenite, and needs to be added in an amount of at least 0.04%. AC content exceeding 0.35% deteriorates spot weldability, a major bonding technique of an automobile structural member in a case, as in the present disclosure, in which an excessive amount of Mn is added. In this regard, it is preferable that an upper limit thereof be set to be 0.35%. Accordingly, it is preferable that the C content be in the range of 0.04% to 0.35%, more preferably, 0.07% to 0.30%.

Al+Si: 0.99% or Less

Al and Si are elements inhibiting deposition of carbides in ferrite and promoting diffusion of carbon in the ferrite into austenite, thereby contributing to stabilization of remaining austenite. An Al+Si content exceeding 0.99% deteriorates spot weldability, thus significantly reducing liquid metal embrittlement. In this regard, it is preferable that an upper limit be set to be 0.99% or less. Meanwhile, a reason why a lower limit of the Al+Si content is not limited and includes 0% is because stability of the remaining austenite can be easily secured without an Al or Si addition in a case, as in the present disclosure, in which an excessive amount of Mn is added. Accordingly, the Al+Si content range is preferably 0.99% or less, more preferably, 0.95% or less.

Mn: 3.5 to 10%

Mn is an element mainly used in metamorphic steel for formation and stabilization of remaining austenite and suppression of ferrite transformation during cooling. In the case that an amount of added Mn is lower than 3.5%, ferrite is likely to transform and austenite may be insufficiently secured, thereby making it difficult to secure mechanical properties. When more than 10% of Mn is added, lead cast production becomes difficult, and a molten steel temperature may be reduced due to an addition of a large amount of ferroalloy, thereby leading to a disadvantage that productivity cannot be stably secured. Accordingly, it is preferable that the Mn content be in the range of 3.5% to 10%, more preferably, 4.0% to 9.0%.

P: 0.05% or Less (Excluding 0%)

P is a solid solution-strengthening element. When a content thereof exceeds 0.05%, weldability is reduced and a risk of brittleness of steel greatly increases. Accordingly, it is preferable that an upper limit thereof be limited to 0.02% or less, and more preferably, 0.01% or less.

S: 0.02% or Less (Excluding 0%)

Similarly to P, S is an impurity element in steel, and is an element inhibiting ductility and weldability of a steel sheet. When a content thereof exceeds 0.02% it is preferable that an upper limit thereof be limited to 0.02%. It is more preferable that the content of S be limited to 0.008% or less.

N: 0.02% or Less (Excluding 0%)

N is a component effectively acting in the stabilization of austenite. When a content thereof exceeds 0.02%, however, a risk of brittleness greatly increases, and due to excessive precipitation of AlN, continuous casting quality is reduced. In this regard, it is preferable that an upper limit thereof be limited to 0.02%. It is more preferable that the content of N be limited to 0.008%.

The steel sheet of the present invention may further include the following alloying components in addition to the above-mentioned alloying components.

Titanium (Ti): 0.15% or Less

Ti is a fine carbide-forming element and contributes to securing strength in the present disclosure. Further, Ti is a nitride-forming element and is advantageous in inhibiting AlN precipitation by scavenging N in the steel with TiN, thereby reducing a risk of cracking during continuous casting. In this regard, it is preferable that at least 48/14*[N] of Ti be added as a chemical equivalent.

Niobium (Nb): 0.5% or Less

Nb is an element segregated at an austenite grain boundary to suppress coarsening of austenite grains during annealing and increase strength through formation of fine carbides. When a content thereof exceeds 0.5%, strength may be reduced by coarse carbide precipitation and a carbon content reduction in steel. Ferroalloy costs may be increased due to excessive alloy input.

Vanadium (V): 0.5% or Less

V contributes to an increase in strength by forming low-temperature precipitates. When a content thereof exceeds 0.5%, however, strength may decrease due to coarse carbide precipitation and a carbon content reduction in steel. A ferroalloy cost may be increased due to excessive alloy input.

Molybdenum (Mo): 0.5% or Less

Mo is advantageous in that Mo suppresses the formation of ferrite by increasing curing ability. Mo also greatly contributes to an increase in strength through the formation of fine carbides. When a content thereof exceeds 0.5%, however, it may give rise to increased ferroalloy costs due to excessive alloy input.

Zirconium (Zr): 0.001% to 0.1% and Tungsten (W): 0.001% to 0.5%

Zr and W, similarly to Ti, Nb, V and Mo, are elements effective in precipitation strengthening and grain refinement of a steel sheet. When Zr and W contents are lower than 0.001%, such effect cannot be obtained, whereas when the Zr content is 0.1% and the W content is higher than 0.5%, there no increase in the effect, and ductility may decrease due to an increased manufacturing cost and excessive precipitates.

Nickel (Ni): 1% or Less, Chromium (Cr): 1.5% or Less and Copper (Cu): 0.5% or Less Ni, Cr and Cu are elements contributing to stabilization of remaining austenite, in combination with the elements C, Si, Mn, and Al described above. When contents of the Ni, Cr and Cu exceed 1%, 1.5%, and 0.5%, respectively, there is a problem of excessively increased manufacturing costs. In addition, Cu in the present disclosure may cause brittleness during hot rolling; accordingly, it is more preferably that Ni be added together when Cu is added.

Cr is an element contributing to stabilization of remaining austenite, in combination with C, Si, Mn, and the like. However, an amount thereof exceeding 1.5% may result in increased manufacturing costs.

Antimony (Sb): 0.1% or Less, Calcium (Ca): 0.01% or Less and B: 0.01% or Less

Sb has an effect of improving surface plating quality by inhibiting movements of surface oxide elements such as Si, Al, and the like, through grain boundary segregation. A Sb amount exceeding 0.1% causes a delay in alloying of a galvanized layer. Ca is an element effective for improving workability by controlling a form of a sulfide. When a content thereof exceeds 0.01%, however, the effect is saturated. Meanwhile, B is advantageous in that as an effect in combination with Mn, Cr, and the like, B improves hardenability to suppress soft ferrite transformation when cooling at a high temperature. When a content thereof exceeds 0.01%, however, an excessive amount of B is concentrated on a surface when prepared as a plated steel sheet, thereby leading to deterioration of plating adhesion.

The remaining element of the present disclosure is iron (Fe). Unintended impurities, however, may be inevitably incorporated from raw materials or the surrounding environment during conventional manufacturing processes, and thus cannot be excluded. These impurities are not specifically mentioned in this specification, as they are known to any person skilled in the art of the conventional manufacturing processes.

Meanwhile, it is preferable that a microstructure of the steel sheet of the present disclosure include at least 10% by volume fraction of residual austenite, at least 60% by volume fraction of annealed martensite and 20% or less by volume fraction of alpha martensite and epsilon martensite. When a fraction of the residual martensite is lower than 10%, a material may not have sufficient work hardening during transformation, resulting in a deterioration of ductility. When a fraction of the alpha martensite and epsilon martensite exceeds 20%, strength may be easily secured, but due to increased dislocations in the material, ductility may significantly deteriorate. Accordingly, such limitation is preferable.

Further, it is preferable that the steel sheet of the present disclosure have an average thickness of at least 0.5 μm from a product surface. The Mn-depleted layer is generated as the residual austenite of the annealed martensite and the residual austenite of the steel sheet surface layer is selectively etched. That is, by etching, the structure of the steel sheet surface layer is mainly composed of soft annealed martensite layers while creating the Mn-depleted layer, thereby significantly improving resistance to LME cracks. In contrast, when a depth of the Mn-depleted layer is less than 0.5 μm, the effect of the Mn-depleted layer on the resistance to LME cracks becomes insignificant. Accordingly, such limitation is preferable.

A size of the Mn-depleted layer-region of the steel sheet surface is not easy to measure by conventional microstructure observation; however, use of an electron probe (Electron Probe X-ray Micro Analyzer, EPMA) enables quantitative measurement of a depth of the Mn-depleted layer. Meanwhile, a three-dimensional depth measurement method is not easy to undertake, but can be replaced with depth measurement through observation of a cross-section used in a conventional microstructure observation.

The steel sheet provided in the present disclosure may be at least one of a cold-rolled steel sheet, a hot-dip galvanized steel sheet, a hot-dip galvannealed steel sheet, an electrolytic galvanized steel sheet, a galvanized PVD steel sheet and a hot-dip aluminum-plated steel sheet.

Hereinafter, a method for manufacturing the steel sheet will be described in detail.

A steel slab satisfying the previously described alloy composition is re-reheated at a temperature of 1100° C. to 1300° C. When the re-heat temperature is below 1100° C., a hot rolling load drastically increase, whereas a temperature higher than 1300° C. causes an increased surface scaling, leading to loss of the material. When a large amount of Mn is contained, a liquid phase may be present. In this regard, the temperature is limited as follows: the re-heat temperature of the steel slab is preferably 1100° C. to 1300° C., more preferably 1100° C. to 1250° C.

The reheated steel slab is subject to finish hot-rolling at a temperature of Ar3 to 1000° C. to obtain a hot-rolled steel sheet. At a temperature below Ar3 (a temperature at which a ferrite starts to appear when cooling austenite), rolling may occur in a dual phase region of ferrite and austenite or ferrite region, resulting in a mixed grain structure. Further, abnormal operations may occur due to hot rolling load variations. In contrast, when the finish hot-rolling temperature is higher than 1000° C., processing costs may increase as the reheating temperature needs to be increased. Further, a slab surface layer oxide removed through descaling during rough milling is re-created to deteriorate quality of the hot-rolled steel sheet.

The hot-rolled steel sheet is coiled at a temperature of 720° C. or below. When the coiling temperature exceeds 720° C., excessive oxide films are formed on the steel sheet surface and may cause surface defects. In this regard, the coiling temperature is limited as follows: as the coiling temperature decreases, the strength of the hot-rolled steel sheet increases, thereby leading to a disadvantage of increased cold-rolling loads of the cold-rolling, a subsequent process; however, there would be no problem in the case of performing heat-treatment before the cold-rolling, as in the present disclosure. Accordingly, there is no lower limit. Meanwhile, when rolling performance of the cold-rolling mill is excellent or in the cases of a reverse rolling mill, the heat-treatment is not necessary before the cold-rolling. Accordingly, the coiling temperature is preferably 720° C. or below, more preferably 650° C. or below.

The coiled hot-rolled steel sheet is treated with heat at a temperature of Ac1 to Ac1+(Ac3−Ac1)/2 for at least 30 minutes. To reduce the strength, coiling should be carried out at an abnormal region temperature, a temperature at which both ferrite and austenite are present. Accordingly, the heat-treatment temperature should be above the Ac1, a temperature at which the austenite starts to produce. When the heat-treatment temperature exceeds Ac1+(Ac3−Ac1)/2, safety of the austenite in the abnormal region is reduced, and a large fraction of the alpha and epsilon martensites are formed when cooling. This causes another increase in the strength of the hot-rolled steel sheet after the heat-treatment, thereby deteriorating cold-rolling. When the heat-treatment is performed for less than 30 minutes, a temperature of an inner coiling portion of the coil cannot reach a target temperature when heat treatment, thereby making it difficult to secure the strength for the cold-rolling. Meanwhile, Ac1 is a temperature point, at which austenite starts to appear when the temperature is raised from a low temperature, and Ac3 is a temperature point, at which austenite becomes 100% at an elevated temperature.

The heat-treated hot-rolled steel sheet is then subject to pickling for at least 5 seconds. The Mn-depleted layer can be formed to have a thickness of 0.5 μm through appropriate time control during the pickling process. When the pickling time is less than 5 seconds, the surface layer oxides may not be sufficiently removed, and the Mn-depleted layer cannot be formed to have a thickness of less than 0.5 μm, thereby causing deterioration of plating and resistance to LME cracks. Accordingly, the pickling time for the heat-treated hot-rolled steel sheet is preferably at least 5 seconds, more preferably at least 10 seconds. Meanwhile, the longer the pickling time is, the more advantageous it is for Mn-depleted layer formation. In this regard, the pickling time is not particularly limited in the present disclosure in terms of an upper limit thereof. However, a pickling time exceeding 3600 seconds may be disadvantageous in that due to over-descaling, a desired cold-rolling thickness may not be secured.

The pickled hot-rolled steel sheet is subject to cold-rolling to obtain a cold-rolled steel sheet. When the cold-rolling is performed after the pickling, a lower limit of the cold reduction ratio should be defined as recrystallization during annealing conventionally varies depending on the cold reduction ratio; however, in the case of performing first annealing heat treatment before final annealing, there would be no significant limit on the cold reduction ratio.

Subsequent to the cold-rolling, the method may further include annealing the cold-rolled steel sheet at a temperature of Ac3 or higher for at least 30 seconds followed by cooling. This is not only to create a martensite phase and a residual austenite phase before the final annealing but also to suppress generation of hardness deviation between the phases, which is generated by recrystallization of the transformed annealed martensite of the cold-rolled steel sheet during the final dual region annealing. For this reason, a first single phase region annealing may be performed prior to the final dual phase region annealing. However, when the heat-treatment is performed at a temperature of Ac3 or above, there would be no significant impact on final physical properties even when two-phase region annealing, in which a very small amount of annealed martensite remains is performed due to kinetics. Meanwhile, the annealing may not be carried out, which is because higher yield strength and tensile strength may be obtained through one-time annealing when appropriately using dislocation density in the material, which increases after the cold-rolling.

After the first annealing, dual phase annealing is performed at a temperature region of 580° C. to 900° C. for 10 seconds to 5 minutes followed by cooling to perform final annealing securing strength and ductility as well as shape quality. Steel grades containing a large amount of Mn, or the like, may obtain excellent tensile strength and ductility when they are subject to heat treatment for at least 30 minutes. However, a substantial method for heat-treating is a batch annealing method involving treating coils, not a continuous annealing facility, with heat, which is disadvantageous in that bending occurs in a rolling length direction after the heat treatment. A lower limit of the continuous annealing time is 10 seconds because sufficient strength and ductility cannot be secured due to a low fraction of the residual austenite after the final annealing if sufficient heat treatment is not performed. In contrast, an upper limit thereof is 5 minutes because annealing for 5 minutes or longer causes excessive heat consumption and thus an increased processing costs. Meanwhile, when the dual annealing temperature is below 580° C., the transformation of the austenite may not be made sufficiently, and a fraction of the final residual austenite may be lower than 10%, disabling the strength and ductility to be simultaneously obtained. In contrast, when the temperature is higher than 900° C., the processing costs excessively increases due to excessive consumption of heat sources. Further, the fraction of the abnormal region austenite significantly increases, and a large amount of alpha martensite and epsilon martensites are formed when cooling. This may enable the strength to be easily obtained but deteriorates the ductility. In this regard, the upper limit should be defined as the above.

The method may further include plating the two-phase annealed cold-rolled steel sheet, where the plating may be one of hot-dip galvanization, hot-dip galva-annealing, electrolytic galvanization, PVD galvanization and hot-dip aluminum plating.

Further, the hot-dip galvanization may be achieved by immersing the two-phase-annealed cold-rolled steel sheet in at least one of a Zn plating bath, a Zn—Al plating bath, an Al—Si plating bath, an Al—Si—Mg plating bath and a Zn—Mg—Al plating bath. The PVD galvanization may be achieved using an electromagnetic levitation physical vapor deposition (EML-PVD) method.

MODE FOR INVENTION

Hereinafter, the present invention will be described in detail with reference to the following Examples. However, these Examples are for illustrative purposes only, and the scope of the present invention is not limited to these Examples.

Example 1

Steels having compositions illustrated in Table 1 below were vacuum-melted with a 30 kg ingot, and then, maintained at a temperature of 1200° C. for 1 hour, followed by hot-rolling to complete finish-rolling at 900° C. and charging the finish-rolled steels into a preheated furnace at 600° C. to be maintained for 1 hour. Thereafter, the steels were furnace-cooled, and hot-rolled coiling thereof was simulated. A specimen cooled to room temperature was subject to heat treatment at 600° C. for 10 hours followed by 30 second pickling, and then cold-rolled at a reduction ratio of 50%. Subsequently, annealing was performed at 820° C. for 2 minutes, followed by cooling. Dual annealing was performed at 640° C. for 2 minutes. A deposition amount of a galvanized layer was plated using an electroplating method after annealing, and spot welding was performed using a dual welding material shown in Table 1. Prior to the spot welding, a microstructure was measured, and a result thereof is shown in Table 2 below.

TABLE 1

| No. | C | Si | Mn | Al | Cr | Ti | Nb | Mo | P | S | N | Al + Si |
|---|---|---|---|---|---|---|---|---|---|---|---|---|
| Inventive steel 1 | 0.12 | 0.018 | 6.9 | 0.023 | — | 0.06 | 0 | 0.25 | 0.01 | 0.0056 | 0.0044 | 0.041 |
| Inventive steel 2 | 0.144 | 0.02 | 6.1 | 0.012 | — | 0.029 | 0.06 | 0 | 0.011 | 0.002 | 0.0058 | 0.032 |
| Inventive steel 3 | 0.142 | 0.018 | 6.1 | 0.014 | — | 0.029 | 0 | 0.064 | 0.009 | 0.0062 | 0.0065 | 0.032 |
| Inventive steel 4 | 0.124 | 0.015 | 7.27 | 0.012 | — | — | — | — | 0.0069 | 0.0057 | 0.0054 | 0.027 |
| Inventive steel 5 | 0.3 | 0.014 | 3.6 | 0.01 | — | — | — | — | 0.0057 | 0.0045 | 0.0045 | 0.024 |
| Inventive steel 6 | 0.15 | 0.012 | 9.6 | 0.014 | 0.5 | | | | 0.0085 | 0.0065 | 0.0063 | 0.026 |
| Inventive steel 7 | 0.1 | 0.02 | 6.0 | 0.014 | — | — | — | — | 0.0061 | 0.0071 | 0.0045 | 0.034 |
| Comparative steel 1 | 0.12 | 1.0 | 7.0 | 1.5 | — | 0 | — | — | 0.0064 | 0.0055 | 0.0047 | 2.5 |
| Comparative steel 2 | 0.14 | 1.0 | 7.0 | 0.012 | — | 0.06 | 0.04 | 0.25 | 0.0085 | 0.0068 | 0.0051 | 1.012 |
| Dual welding material | 0.001 | 0.003 | 0.05 | 0.024 | — | 0.074 | — | — | 0.0059 | 0.0041 | 0.0016 | 0.027 |

TABLE 2

| Classification | Microstructure (volume %) | | | |
|---|---|---|---|---|
| | Residual austenite | Annealed martensite | Alpha martensite | Epsilon martensite |
| Inventive steel 1 | 25 | 68.8 | 5.0 | 1.2 |
| Inventive steel 2 | 23.5 | 75.2 | 1.3 | 0 |
| Inventive steel 3 | 28.5 | 67.3 | 2.7 | 1.5 |
| Inventive steel 4 | 26.3 | 67.3 | 3.9 | 2.5 |
| Inventive steel 5 | 29.8 | 68.5 | 0 | 1.7 |
| Inventive steel 6 | 30.7 | 67.2 | 0 | 2.1 |
| Inventive steel 7 | 21.2 | 72.8 | 6 | 0 |
| Comparative steel 1 | 30.5 | 67.1 | 1.2 | 1.2 |
| Comparative steel 2 | 24.5 | 73.1 | 1.4 | 1.0 |

ISO standard spot welding requirements applied to observe resistance to LME cracks are shown in Table 3 below. A Maximum current generating a spark was calculated based on the ISO standard to observe the resistance to LME. Spot welding was then carried at the maximum current value of −0.5 kA. The dual welding material of Table 1 and a maximum crack size of the welded portion after the spot welding were measured for each crack type, and a result thereof is shown in Table 3 below.

TABLE 3

| Standard | Thickness (mm) | No. of energization | Electrode type(mm) | Pressure (kN) | Welding time(ms) | Cooling time(ms) | Pressure retention time(ms) |
|---|---|---|---|---|---|---|---|
| ISO 18278-2: 2016 | 1.35 to 1.64 | 1 | F1-16-20-50-6 | 4.5 | 380 | — | 260 |

TABLE 4

| Steel type | Specimen thickness (mm) | Max current (kA) | Depth of Mn-depleted layer (μm) | Max LME crack (μm) | | |
|---|---|---|---|---|---|---|
| | | | | Type A | Type B | Type C |
| Inventive steel 1 | 1.4 | 7.8 | 2.9 | N/D* | N/D | N/D |
| Inventive steel 2 | 1.45 | 10.0 | 11.0 | N/D | 46 | N/D |
| Inventive steel 3 | 1.43 | 10.2 | 8.3 | N/D | 35 | N/D |
| Inventive steel 4 | 1.4 | 8.2 | 6.1 | N/D | 27 | N/D |
| Inventive steel 5 | 1.41 | 7.6 | 6.0 | N/D | 25 | N/D |
| Inventive steel 6 | 1.42 | 11.5 | 7.8 | N/D | 44 | N/D |
| Inventive steel 7 | 1.43 | 8.5 | 0.8 | N/D | 30 | N/D |
| Comparative steel 1 | 1.41 | 8.8 | 2.2 | N/D | 535 | N/D |
| Comparative steel 2 | 1.4 | 8.4 | 0.3 | N/D | 549 | N/D |

*N/D: not observed under a 100x optical microscope

As shown in Tables 1 to 4, the alloy composition suggested in the present disclosure, particularly inventive steels 1 to 7, which satisfy the Al+Si content and the depth of the Mn-depleted layer, has a crack having a maximum size of 0.1 t (t: thickness of material (unit: mm)) or less during spot welding, indicating excellent LME activity.

In contrast, comparative steels 1 and 2 have a crack having a maximum size exceeding 0.1 t, indicating that they have poor resistance to cracking. In the case of comparative steel 1, a depth of the Mn-depleted layer is 2.2 µm, which is a satisfactory level; however, the Al+Si content is greater than 0.99%, a level suggested in the present disclosure, indicating poor resistance to cracking. Further, in the case of comparative steel, not only the Al+Si content exceeds 0.99% but also the depth of the Mn-depleted layer is less than 0.5 µm, thereby giving rise to greatly reduced resistance to cracking and thus showing a larger size of cracks compared to comparative steel 1.

Figure 2:
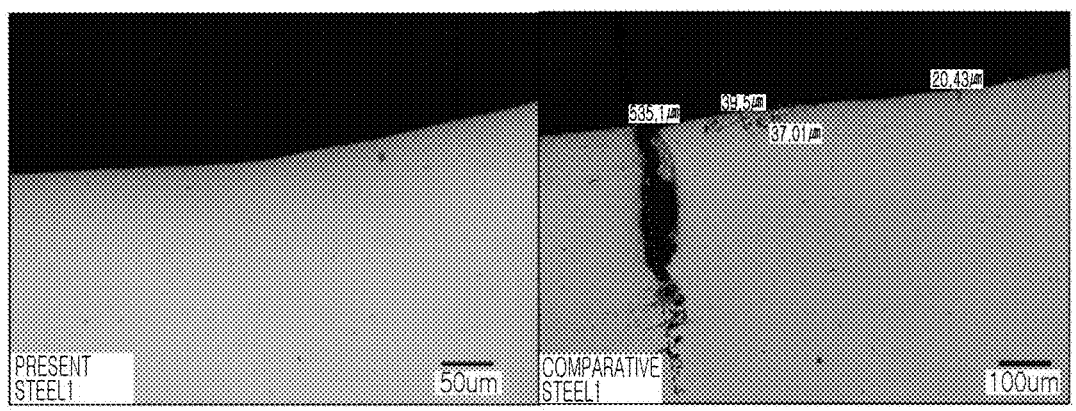
FIG. 2 is photographic images of welded portions of inventive steel 1 and comparative steel 2 of Example 1, observed using an electron probe X-ray micro analyzer (EPMA).
Figure 3:
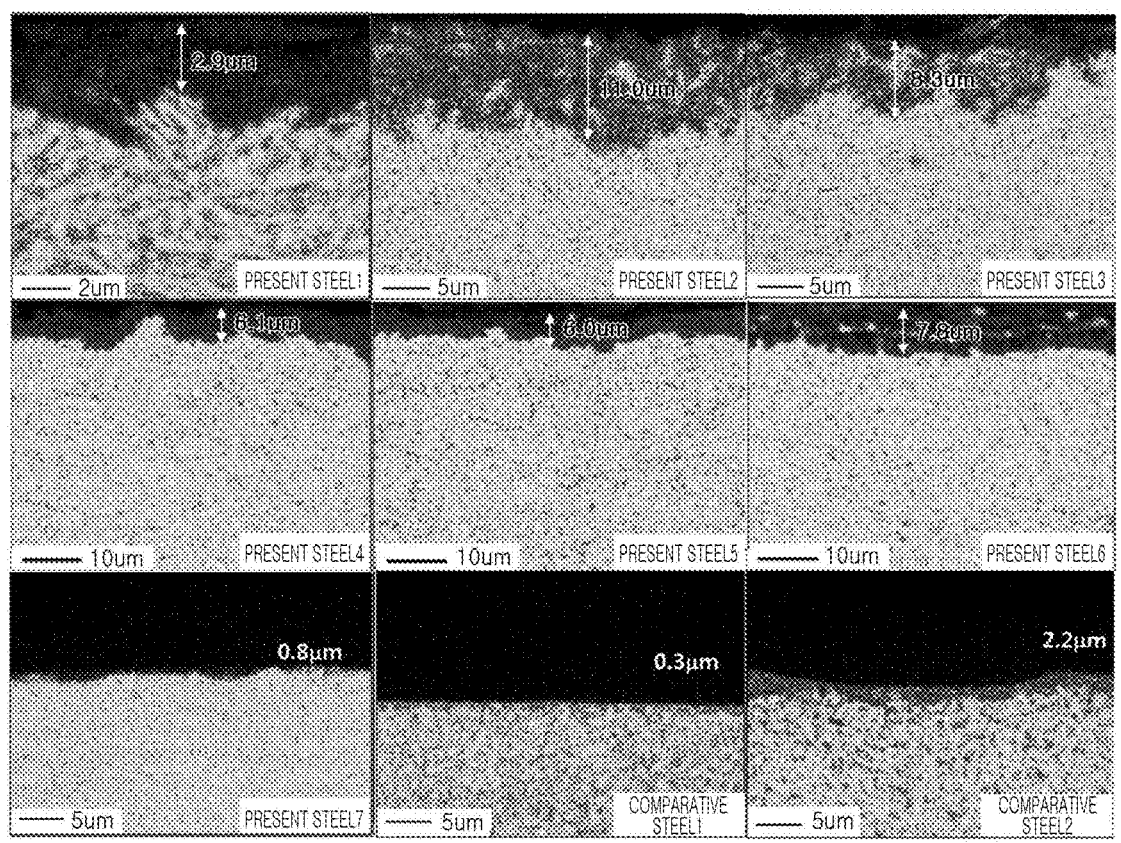
FIG. 3 is photographic images of Mn-depleted layers of inventive steels 1 to 7 and Comparative Examples 1 and 2.

FIG. 2 is photographic images of welded portions of inventive steel 1 and comparative steel 2 of Example 1, observed using an electron probe X-ray micro analyzer (EPMA). FIG. 3 is photographic images of the Mn-depleted layers of inventive steels 1 to 7 and Comparative Examples 1 and 2. As illustrated in FIG. 2, comparative steel 2 rarely had cracks whereas comparative steel 1 contained a relatively large crack.

Example 2

A steel having the alloy composition of inventive steel 1 was used to manufacture a steel sheet under the same manufacture conditions as those of Example 1 except the pickling time as described in Table 5 below. After spot welding, thus-prepared steel sheet and the Mn-depleted layer were measured with respect to a maximum size of each crack type of the welded portion. A result thereof is shown in Table 5 below.

TABLE 5

| Steel type | Classification | Specimen thickness (mm) | Max current (kA) | Pickling time(s) | Depth of Mn-depleted layer (µm) | Max LME crack (µm) | | |
|---|---|---|---|---|---|---|---|---|
| | | | | | | Type A | Type B | Type C |
| Inventive steel 1 | Inventive steel 1 | 1.4 | 7.8 | 25 | 2.9 | N/D | N/D | N/D |
| | Inventive steel 2 | | | 15 | 1.5 | N/D | 37 | N/D |
| | Comparative steel 1 | | | 3 | 0.4 | N/D | 160 | N/D |

* N/D: not observed under a 100x optical microscope

As shown in Table 5 above, the Mn-depleted layers of inventive steel 1 and 2 satisfying the pickling time suggested in the present disclosure are formed to have a depth of at least 0.5 µm, and accordingly have excellent resistance to LME cracks. In contrast, the pickling time of Comparative Example 1 is less than 5 seconds despite 0.99%, of the Al+Si content, and thus, a depth of the Mn-depleted layer is less than 0.5 µm, thereby indicating poor resistance to LME cracks. In this regard, the crack size was measured to be greater than 0.1 t.

Figure 4:
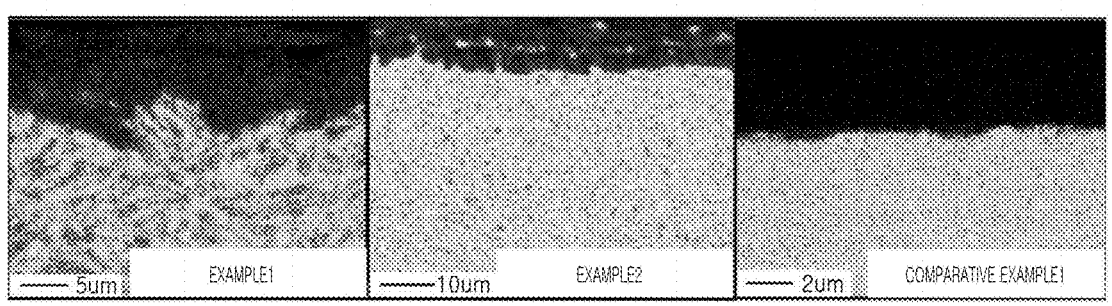
FIG. 4 is photographic images of inventive examples 1 and 2 and Comparative Example 1 of Example 2: (A) is photographic images of the Mn-depleted layers, and (B) is photographic images of the welded portion observed using an EPMA.
Figure 4:
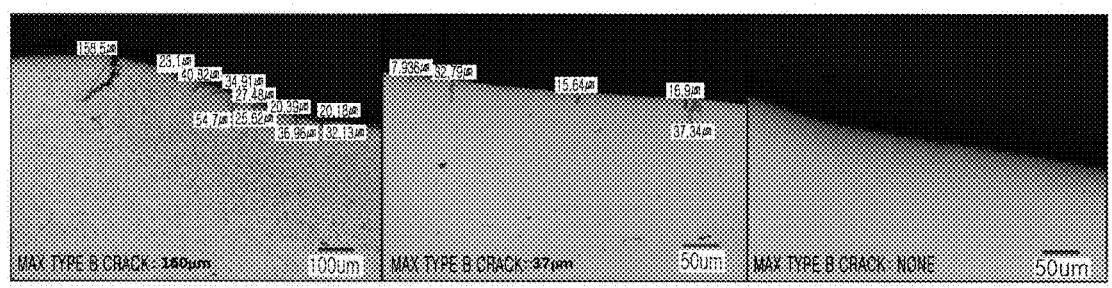

FIG. 4 is photographic images illustrating the inventive examples 1 and 2 and comparative example 1 of Example 2: (A) is photographic images of the Mn-depleted layers, and (B) is photographic images of the welded portion observed using an EPMA. As shown in FIG. 4, inventive examples 1 and 2 contained no cracks or barely contained cracks, whereas comparative example 1 contained relatively large cracks.

The invention claimed is:

1. A steel sheet having excellent resistance to liquid metal embrittlement cracks, the steel sheet comprising:
   by weight %, 0.04% to 0.35% of C, 0.99% or less of Al+Si, 3.5% to 10% of Mn, 0.05% or less of P (excluding 0%), 0.02% or less of S (excluding 0%), and 0.02% or less of N (excluding 0%) with a remainder of Fe and other inevitable impurities;
   a microstructure comprising: at least 10% by volume fraction of residual austenite, at least 60% by volume fraction of annealed martensite, and 20% or less by volume fraction of alpha martensite and epsilon martensite; and
   a Mn-depleted layer having an average thickness of at least 0.5 µm from a surface of the steel sheet.

2. The steel sheet of claim 1, further comprising: at least one selected from the group consisting of 0.15% or less of Ti, 0.5 or less of Nb, 0.5 or less of V and 0.5 or less of Mo.

3. The steel sheet of claim 1, further comprising: at least one of 0.001% to 0.1% of Zr and 0.001% to 0.5% of W.

4. The steel sheet of claim 1, further comprising: at least one selected from the group consisting of 1% or less of Ni, 1.5% or less of Cr and 0.5% or less of Cu.

5. The steel sheet of claim 1, further comprising: at least one selected from the group consisting of 0.1% or less of Sb, 0.01% or less of Ca and 0.01% or less of B.

6. The steel sheet of claim 1, wherein the steel sheet is one of a cold-rolled steel sheet, a hot-dip galvanized steel sheet, a hot-dip galvannealed steel sheet, an electrolytic galvanized steel sheet, a PVD galvanized steel sheet and a hot-dip aluminum-plated steel sheet.

7. A method of manufacturing a steel sheet having excellent resistance to liquid metal embrittlement cracks, the method comprising:
   reheating a steel slab comprising: 0.04% to 0.35% of C, 0.99% or less of Al+Si, 3.5% to 10% of Mn, 1.5% or less of Cr (excluding 0%), 0.05% or less of P (excluding 0%), 0.02% or less of S (excluding 0%), and 0.02% or less of N (excluding 0%) with a remainder of Fe and other inevitable impurities, by weight %, at a temperature of 1100° C. to 1300° C.;
   finish-hot-rolling the reheated steel slab at a temperature of Ar3 to 1000° C. to obtain a hot-rolled steel sheet;
   coiling the hot-rolled steel sheet at a temperature of 720° C. or less;
   heat-treating the coiled hot-rolled steel sheet at a temperature in a range of Ac1 to Ac1+(Ac3−Ac1)/2 for at least 30 minutes;
   pickling the heat-treated hot-rolled steel sheet for at least 5 seconds;

cold-rolling the pickled hot-rolled steel sheet to obtain a cold-rolled steel sheet; and two-phase annealing the cold-rolled steel sheet a temperature in the range of 580° C. to 900° C. for 10 seconds to 5 minutes.

8. The method of claim 7, wherein the steel slab further comprises: at least one selected from the group consisting of 0.15% or less of Ti, 0.5% or less of Nb, 0.5% or less of V and 0.5% or less of Mo.

9. The method of claim 7, wherein the steel slab further comprises: at least one of 0.001% to 0.1% of Zr and 0.001% to 0.5% of W.

10. The method of claim 7, wherein the steel slab further comprises: at least one selected from the group consisting of 1% or less of Ni, 1.5% or less of Cr and 0.5% or less of Cu.

11. The method of claim 7, wherein the steel slab further comprises: at least one selected from the group consisting of 0.1% or less of Sb, 0.01% or less of Ca and 0.01% or less of B.

12. The method of claim 7, further comprising: annealing the cold-rolled steel sheet at a temperature of at least Ac3 for at least 30 seconds and cooling the annealed cold-rolled steel sheet, before the two-phase annealing.

13. The method of claim 7, further comprising: plating the two-phase-annealed cold-rolled steel sheet.

14. The method of claim 13, wherein the plating is at least one of hot-dip galvanization, hot-dip galva-annealing, electrolytic galvanization, PVD galvanization and hot-dip aluminum plating.

15. The method of claim 14, wherein the hot-dip galvanization is achieved by immersing the two-phase-annealed cold-rolled steel sheet in at least one of a Zn plating bath, a Zn—Al plating bath, an Al—Si plating bath, an Al—Si—Mg plating bath and a Zn—Mg—Al plating bath.

16. The method of claim 14, wherein the PVD galvanization is achieved using an electromagnetic levitation physical vapor deposition (EML-PVD) method.

* * * * *